United States Patent [19]

Abraham-Fuchs

[11] Patent Number: 5,136,242
[45] Date of Patent: Aug. 4, 1992

[54] METHOD FOR MEASURING THE FIELD PATTERN OF ELECTRICAL OR MAGNETIC FIELDS EMANATING FROM A BIOLOGICAL POWER SOURCE USING A SENSOR ARRANGEMENT FOR OBTAINING CHRONOLOGICAL MAP OF THE POSITION OF THE BIOLOGICAL POWER SOURCE

[75] Inventor: Klaus Abraham-Fuchs, Erlangen, Fed. Rep. of Germany

[73] Assignee: Siemens Aktiengesellschaft, Munich, Fed. Rep. of Germany

[21] Appl. No.: 653,509

[22] Filed: Feb. 11, 1991

[30] Foreign Application Priority Data

Feb. 22, 1990 [EP] European Pat. Off. ........ 90103479.3

[51] Int. Cl.$^5$ ............................................ G01R 33/022
[52] U.S. Cl. ................................. 324/244; 128/653.1; 324/72; 324/248; 324/301; 364/571.02; 364/581
[58] Field of Search ............... 324/244, 248, 301, 72; 364/459, 570, 571, 581, 571.02; 128/653 R, 653 A, 653 SC

[56] References Cited

U.S. PATENT DOCUMENTS

| | | | |
|---|---|---|---|
| 4,591,787 | 5/1986 | Hoenig | 324/248 |
| 4,613,817 | 9/1986 | Hoenig | 324/248 |
| 4,739,262 | 4/1988 | Fleetwood . | |
| 4,761,611 | 8/1988 | Hoenig | 324/248 |
| 4,977,896 | 12/1980 | Robinson et al. | 324/248 X |
| 4,982,157 | 1/1991 | Seifert | 324/248 |
| 4,995,395 | 2/1991 | Ilmoniemi et al. | 324/248 X |

FOREIGN PATENT DOCUMENTS 2619454 2/1989 France .
246688 10/1988 Japan .................................. 324/248

OTHER PUBLICATIONS

"A multi-channel system for use in biomagnetic diagnosis in neurology and cardiology: principle, method and initial results," Gudden et al., Electromedica vol. 57, No. 1, Jan., 1989 pp. 1-40.
Patent Abstracts of Japan, vol. 9, No. 86 (P-349) for Japanese Application 59-216077.

*Primary Examiner*—Kenneth A. Wieder
*Assistant Examiner*—Warren S. Edmonds
*Attorney, Agent, or Firm*—Hill, Van Santen, Steadman & Simpson

[57] ABSTRACT

A method for measuring the field pattern of electrical or magnetic fields using a sensor arrangement, for determining the spatial position of a biological power source is disclosed which compensates for background activity. The method includes the steps of measuring the background activity at a time before the biological power source is stimulated, and the resultant signal vector of the background activity is formed. This signal vector of the background activity is vectorially subtracted from each resultant vector of the subsequently obtained values from the biological power source, so that a signal vector is obtained which is essentially caused only by the current from the power source. A weighting factor, which varies the length of the vector of the background field, is iteratively calculated together with the source parameters for the biological power source by error minimization, so that the parameters of the power source can be optimally portrayed.

1 Claim, 2 Drawing Sheets

METHOD FOR MEASURING THE FIELD PATTERN OF ELECTRICAL OR MAGNETIC FIELDS EMANATING FROM A BIOLOGICAL POWER SOURCE USING A SENSOR ARRANGEMENT FOR OBTAINING CHRONOLOGICAL MAP OF THE POSITION OF THE BIOLOGICAL POWER SOURCE

BACKGROUND OF THE INVENTION

1. Field of the Invention

The present invention is directed to a method for measuring the field pattern of electrical or magnetic fields using a sensor arrangement, as well as with a data processing system for iterative calculation of the spatial position of a biological power source which causes the field.

2. Description of the Prior Art

The measurement of magnetic fields which are weaker by several powers of ten in comparison to the earth's magnetic field is necessary for use in measuring biomagnetic activities. This requires measuring external fields emanating from nerve currents in the inside of a living organism using sensors at various locations, and calculating a dipole equivalent to the location of the source based on the field pattern measured by sensors, and with a corresponding data evaluation program. The measuring instruments required for this purpose must be extraordinarily sensitive, and special gradiometers are employed for these purposes, contained under superconducting conditions in a Dewar vessel together with a superconducting quantum interferometer device (SQUID). In order to make a meaningful measurement for this manner, the external noise fields must be shielded in the best manner possible. To that end, the patient and the measuring apparatus are accommodated in a walk-in magnetically shielded chamber. To be able to calculate the field distributions as quickly as possible, multi-channel systems have been developed as disclosed, for example, in the publication "Electromedica," Vol. 57, 1989, pp. 2–7.

It is not only the noise fields which act externally, and falisfy the measured result. It is often the case that the bioelectric power source causing the external magnetic field is additively superimposed with the activities of a neighboring source. This "background activity" can result in an error in the localization of the biological power source in question. This particularly arises in the case of biomagnetic cardiac activities (magnetocardiogram). When such a superimposed field is known with sufficient precision, it can be subtracted from the measured field to obtain the field of the power source in question. Such a constant activity, however, is not present, particularly given the stimulation currents in the heart. Thus, an electro-physiological activity in this region during a known time segment generates an electrical or magnetic field whose spatial field pattern remains approximately constant in this time span, but changes by an amplitude factor dependent on time, for example, slowly increases and decreases. The curve of this chronological change in the amplitude factor is unknown. For example, such a change arises when an electro-physiological activity remains stable in terms of location and direction, but the power density of the ion flux slowly decreases. This occurs, for example, in the repolarization of the cardiac atria in the P-Q interval of the heart cycle. After the beginning of a defined time segment (time window), this activity having a constant field pattern is superimposed on a further activity which is to be localized. This background field pattern can be measured at a defined time preceding the beginning of the activity which is to be localized, and if this activity were to remain constant, could be subtracted from the field pattern to be measured. In the case of the above practical application, however, the background activity does not remain constant during the duration of the measuring cycle to permit the activity to be calculated with sufficient precision, so that the above simple subtraction method cannot be used.

SUMMARY OF THE INVENTION

It is an object of the present invention to provide a method for measuring weak magnetic fields of the type described above wherein the background activity can be identified with sufficient precision to be able to be subtracted from the measured signals, so that only signals identifying the biological power source in question remain.

The above object is achieved in a method wherein the field pattern of background activity having a physiological of technical origin can be defined at a specific time before the stimulation of the biological activity to be measured. The amplitude curve of the background activity is then constructed and is taken into consideration during the duration of the measuring period by subtracting it from the overall measured quantity, with the background activity having its proper amplitude at each measuring time. This is accomplished by allocating a weighting factor to the vector of the background field, so that the amplitude fluctuation thereof dependent on the time can be identified for each individual measuring time. This method results in the field difference between the measuring field and the field emanating from the power source to be accurately identified, and therefore the pattern of the field itself can be optimally identified.

DESCRIPTION OF THE PREFERRED EMBODIMENTS

Figure 1:
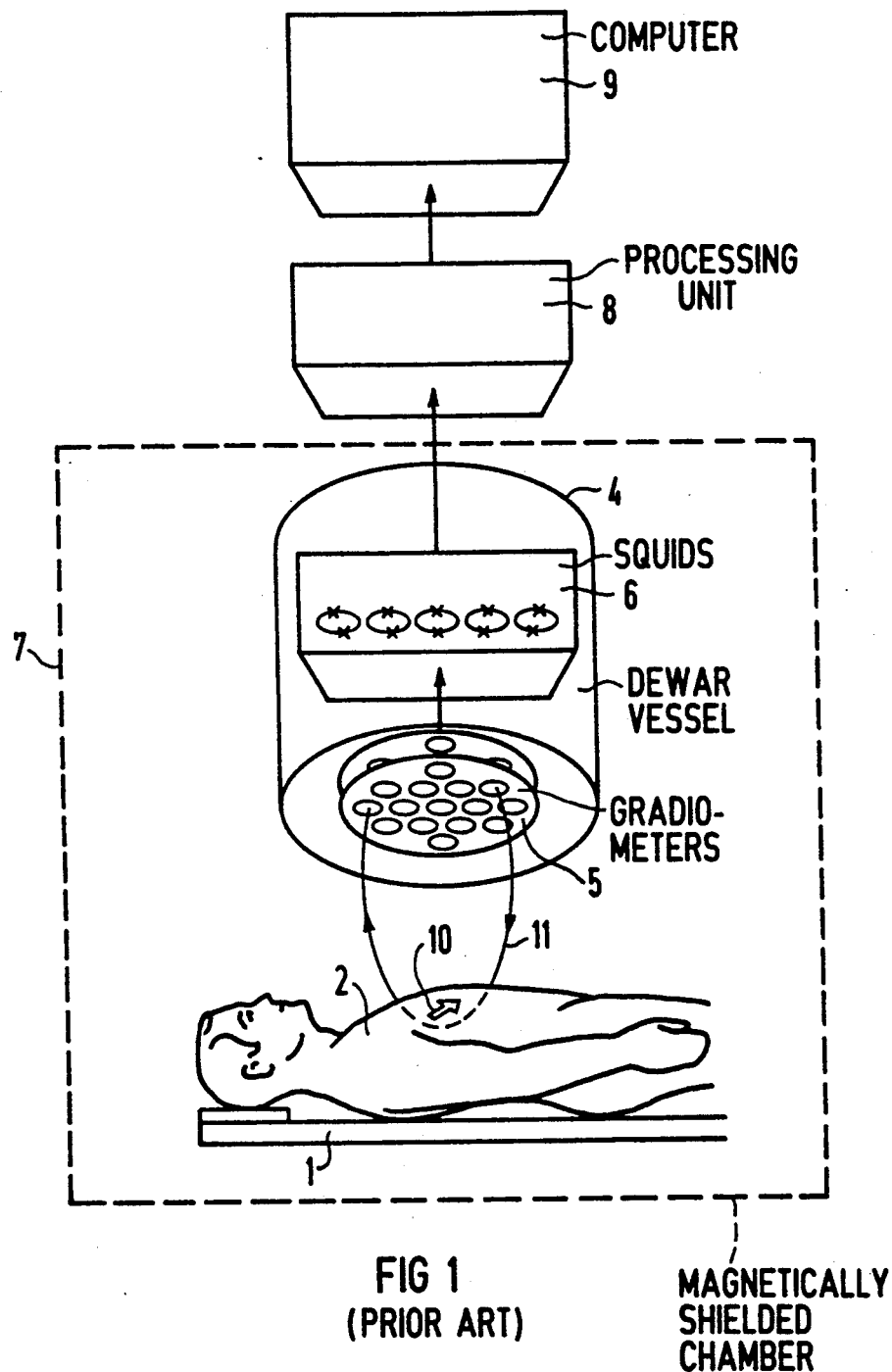
FIG. 1 is a schematic block diagram of a standard measuring arrangement for magneto-cardiographic measurements, using a multi-channel gradiometer with SQUID elements.

A conventional arrangement for measuring weak magnetic fields, of the type necessary to undertake biomagnetic measurements is shown in FIG. 1, and includes a patient support 1 on which a patient 2 is disposed, and a Dewar vessel 4 arranged over the patient. The Dewar vessel 4 contains a multi-channel gradiometer arrangement 5 and dc SQUIDs 6 allocated to the gradiometers. The patient support 1 and the Dewar vessel 4 are contained in a shielded chamber 7 to prevent the influence of external magnetic fields. An electronic processing unit 8 serves to control and supply power to the SQUIDs 6 and the gradiometers 5. A computer 9 is connected to the processing electronics 8, which evaluates the signals of the measured values obtained from the SQUIDs 6 and the gradiometers 5, to obtain the chronological curve of the magnetic field 11 which emanates from an equivalent dipole 10 in the patient 2, and which surrounds the body of the patient 2 at the various measuring locations. This calculation is undertaken according to a specific iteration algorithm.

The measured magnetic field pattern, however, is usually not generated by only a single, spatially localizable, biological power source. To the contrary, it frequently is the case that an activity whose current source is to be localized is superimposed with a further activity which may, for example, derive from preceding activity which diffusely spreads over a larger tissue complex, spreading with an increasing or decaying amplitude and thus additively superimposing on the field of the power source to be identified. Such a background field is capable of influencing the field pattern of interest such that the evaluation results in a false localization of the biological power source.

Figure 2:
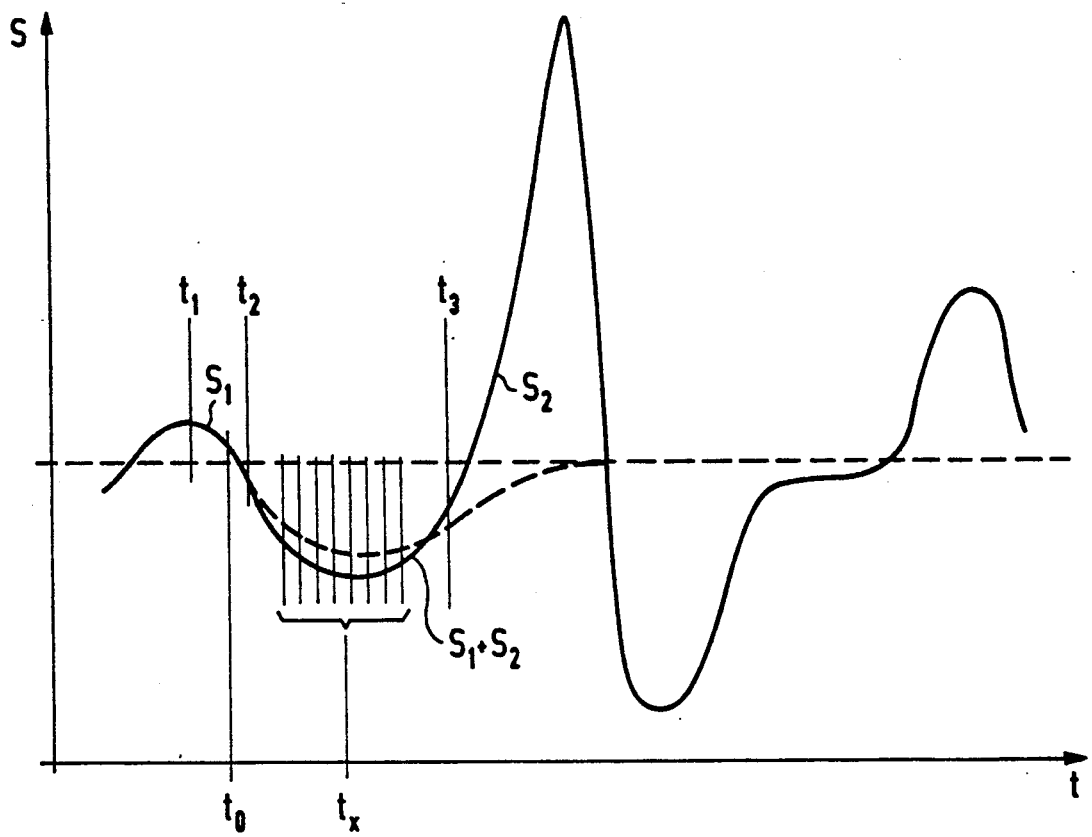
FIG. 2 is a portion of a chronological curve of the type obtained form a single SQUID gradiometer in the measuring arrangement of FIG. 1.

A typical chronological curve of an external magnetic field (MKG) is shown in FIG. 2, which is obtained from cardiac activity measured at the location of one of the gradiometers 5. Only one portion (time window) of the curve should be considered. The time window begins with time $t_1$ and ends at time $t_3$. The activity $S_1$, decaying at time $t_1$ derives from the repolarization of the cardiac atria in the P-Q interval of the heart cycle. This is an activity whose magnetic field pattern remains approximately constant in this time span, but changes by an amplitude factor, i.e. slowly increases and decreases. This chronological change in the amplitude factor is unknown. It may arise, for example, if an electro-physiological activity remains stable in location and direction, but the power density of the ion flux slowly decreases. The amplitude of this activity $S_1$ decays correspondingly. At time $t_2$, the cardiac ventricle activity $S_2$ then begins, which is to be localized. The two activities are superimposed during the entire duration of the time window. The signal measured by the sensors at a time t can be described in vectorial representation in the following way:

$$||\vec{S}_N(M)(t) = \vec{S}_N(Q)(t) + \vec{S}_N(B)(t) + \vec{S}_N(R)(t)||.$$

To avoid a localization error, the activity $S_1$ must be subtracted from the activity $S_2$. To that end, the activity $S_1$ is first calculated at time $t_0$, at which only the activity $S_1$ appears. Since the amplitude of this activity is not constant over time, subtraction according to the equation $$||\vec{S}(M)(t_x) - [[\vec{S}_N(Q_i)(t_x) + \vec{S}_N(B)(t_0) + \vec{S}_N(R)(t)]]|| = 0$$

does not lead to the desired result. To the contrary, the introduction of a weighting factor W is required for this purpose; the vector of the background $\vec{S}_N(B)$ at the respective measuring time $t_x$ must be multiplied by this weighting factor. Leaving the vector $\vec{S}_N(R)(t)$ out of consideration, the equation then reads:

$$||\vec{S}_N(M)(t_x) - [\vec{S}_N(Q_i)(t_x) + W(t_x \times \vec{S}_N(B)(t_0))]|| = \text{Minimum}.$$

In the above equations,
$\vec{S}_N(M)(t)$ = vector of the measured $S_1 + S_2$ in N sensors at times t;

$\vec{S}_N(Q)(t)$ = vector of the signal $S_2$ of the sought power source at the overall signal in N sensors at time t;
$\vec{S}_N(B)(t)$ = vector of the background activity $S_1$ in N sensors at time t;
$\vec{S}_N(R)(t)$ = vector of the noise part in N sensors at time t;
$W(t)$ = weighting factor for the length of the vector $\vec{S}_N(B)(t)$;
$Q_i(t_x)$ = parameters that unambiguously define the power source and, thus, the signal thereof at time $t_x$.

The above equation does not become zero because the background is additively composed of the actual background activity $\vec{S}_N(B)$ and the fixed noise part $\vec{S}_N(R)$.

Figure 3:
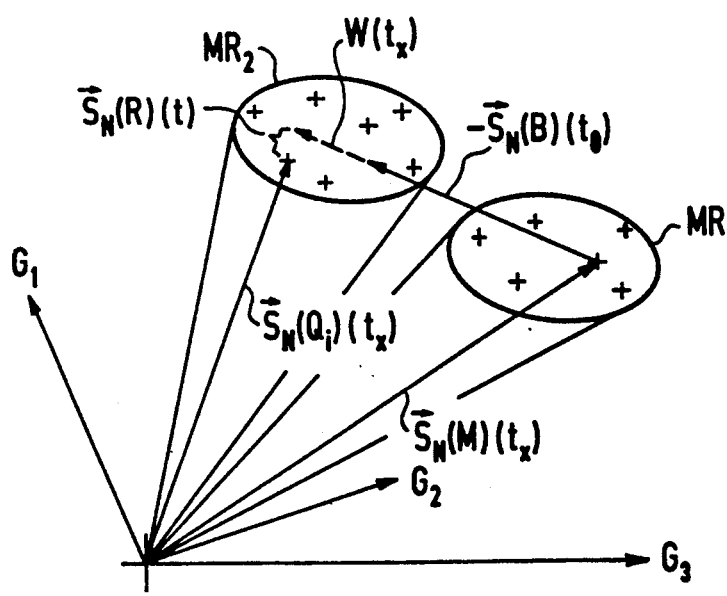
FIG. 3 is a vector diagram for explaining the method disclosed herein, having two measured value sub-spaces which geometrically illustrate the relationship of measured value signal, the source signal, and the background signal.

This procedure is graphically shown in FIG. 3. As shown therein, the measured value vector $\vec{S}_N(M)$ describes a point in the measured values sub-space $MR_1$. The entire measured value sub-space is constructed by signals from each of the three illustrated sensors $G_1$, $G_2$ and $G_3$ and has the dimension N, whereby N is the number of sensors. (In practice, the number of sensors is significantly higher, for example 37.)

Signal $\vec{S}_N(Q)$ of this given model power source (for example, a power dipole) can only describe discrete points in the measured value sub-space upon variation of all source parameters $Q_i$, these discrete points being marked by crosses as an example. The search strategy now seeks the signal vector of all possible signal vectors of the power source $\vec{S}_N(Q)$ which comes closest to the current measured value $\vec{S}_N(M)$. If the solution of the power source were sought without a correction referred to the background field $\vec{S}_N(B)$, a solution in the measured value sub-space $MR_1$ would be obtained. This would, however, lead to a faulty source locating. Due to the subtraction of the background field $\vec{S}_N(B)$, the search strategy is initiated to seek a solution in the proximity of the new, corrected measured value $\vec{S}_N(M) - \vec{S}_N(B)$, i.e., the measured value in sub-space $MR_2$. The weighting factor W for correcting the length of the vector $\vec{S}_N(B)$ is iteratively optimized so that the resulting vector $W\vec{S}_N(B)$ comes as close as possible to the correct solution.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method identifying parameters defining the spatial position of a biological power source in a region of a patient, said biological power source causing a field pattern of an electrical or magnetic field, in the presence of background activity which causes a further electric or magnetic field pattern, stable in time, superimposed on said field patterns from said power source, said method comprising the steps of:
   measuring background field activity B at a time $t_0$ using N sensors before field activity from said power source is present to obtain a resultant background signal vector $\vec{S}_N(B)(t_0)$ from the chronological amplitude curve and stable spatial distribution of said background activity B;
   measuring superimposed power source and background field activity at times $t_x$ between times $t_2$ and $t_3$, following $t_0$, using said N sensors to obtain a resultant signal vector $\vec{S}_N(M)(t_x)$ from the chronological amplitude curve and spatial distribution of the superimposed power source and background field activity;

for each time $t_x$, multiplying said background signal vector $\vec{S}_N(B)(t_0)$ by a weighting factor $W(t_x)$ thereby altering the length of said background signal vector to obtain a product vector, $(W)(t_x) \times \vec{S}_N(B)(t_0)$; and subtracting said product vector and a power source signal vector $\vec{S}_N(Q)(t_x)$ defined by said parameters (Q) from said resultant signal vector $\vec{S}_N(M)(t_x)$ at each time $t_x$ to obtain a difference;

conducing an iterative calculating of said weighting factor $W(t_x)$ and said parameters (Q) so that said difference is minimized; and generating and displaying a chronological map of the position of said biological power source in said region of said patient over said times $t_x$.

* * * * *